United States Patent
Zhang et al.

(10) Patent No.: US 11,374,203 B2
(45) Date of Patent: Jun. 28, 2022

(54) MASK CAPABLE OF FORMING EDGE SLOPE CORNER OF ORGANIC FILM LAYER

(71) Applicant: Wuhan China Star Optoelectronics Semiconductor Display Technology Co., Ltd., Wuhan (CN)

(72) Inventors: Yonghui Zhang, Wuhan (CN); Peng Li, Wuhan (CN)

(73) Assignee: Wuhan China Star Optoelectronics Sexiconduetor Display Technology Co., Ltd., Wuhan (CN)

( * ) Notice: Subject to any disclaimer, the term of this patent is extended or adjusted under 35 U.S.C. 154(b) by 296 days.

(21) Appl. No.: 16/613,425

(22) PCT Filed: Sep. 20, 2019

(86) PCT No.: PCT/CN2019/106892
§ 371 (c)(1),
(2) Date: Nov. 14, 2019

(87) PCT Pub. No.: WO2020/237928
PCT Pub. Date: Dec. 3, 2020

(65) Prior Publication Data
US 2021/0408490 A1    Dec. 30, 2021

(30) Foreign Application Priority Data
May 30, 2019 (CN) .......................... 201910465027.0

(51) Int. Cl.
*H01L 51/52* (2006.01)
*G03F 1/54* (2012.01)
*H01L 27/32* (2006.01)

(52) U.S. Cl.
CPC ............ *H01L 51/5275* (2013.01); *G03F 1/54* (2013.01); *H01L 27/3246* (2013.01)

(58) Field of Classification Search
USPC .......................................... 257/40
See application file for complete search history.

(56) References Cited

U.S. PATENT DOCUMENTS

| 2007/0054204 A1 | 3/2007 | Misaka | |
| 2008/0107972 A1* | 5/2008 | Yamayoshi | ............ G03F 1/50 430/323 |
| 2009/0140438 A1* | 6/2009 | Yamazaki | ......... H01L 29/78696 257/784 |

(Continued)

FOREIGN PATENT DOCUMENTS

| CN | 1455299 | 11/2003 |
| CN | 102495524 | 6/2012 |

(Continued)

*Primary Examiner* — Nduka E Ojeh

(57) ABSTRACT

An organic light-emitting diode (OLED) display panel and a mask are disclosed. The OLED display panel includes a first film layer, and a second film layer disposed on the first film layer and made of an organic material. The second film layer includes an edge slope corner formed at an acute angle less than a predetermined value. Since the edge slope corner of the second film layer is formed at the acute angle less than a predetermined value, a technical problem existing in conventional OLED display panels that edge slope corners of organic layers are formed at approximately a right angle can be mitigated.

13 Claims, 6 Drawing Sheets

(56) References Cited

U.S. PATENT DOCUMENTS

2016/0380224 A1* 12/2016 Kim .................... H01L 27/3246
                                                         257/40
2018/0314099 A1* 11/2018 Saitoh ................... G02F 1/1345
2020/0117028 A1    4/2020 Ye et al.

FOREIGN PATENT DOCUMENTS

CN      103034045    4/2013
CN      208908224    5/2019

* cited by examiner

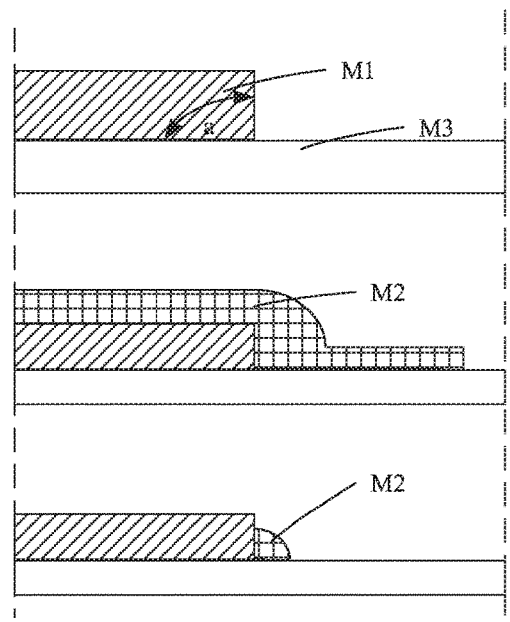 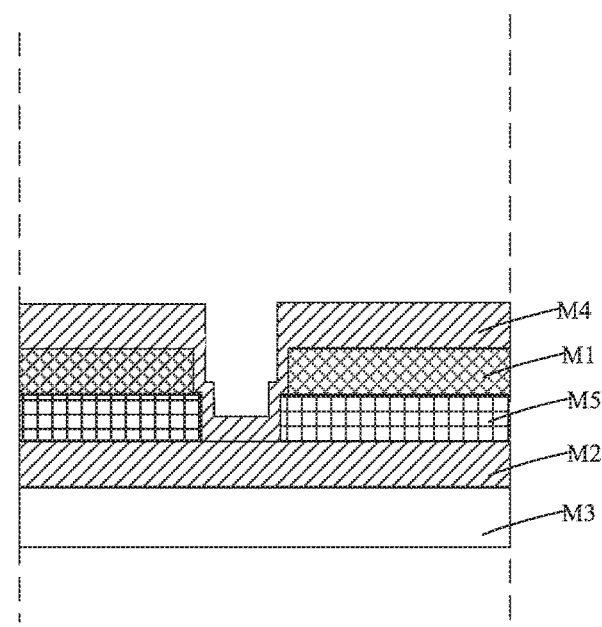
FIG. 1 (1)(Prior Art)   FIG. 1 (2)(Prior Art)

MASK CAPABLE OF FORMING EDGE SLOPE CORNER OF ORGANIC FILM LAYER

RELATED APPLICATIONS

This application is a National Phase of PCT Patent Application No. PCT/CN2019/106892 having International filing date of Sep. 20, 2019, which claims the benefit of priority Chinese Patent Application No. 201910465027.0 filed on May 30, 2019. The contents of the above applications are all incorporated by reference as if fully set forth herein in their entirety.

FIELD AND BACKGROUND OF THE INVENTION

The present invention relates to a technical field of displays, and particularly to, an organic light-emitting diode (OLED) display panel, and a mask.

When fabricating organic light-emitting diode (OLED) display panels, it is often necessary to perform a photolithography process on organic layers to form desired patterns, then forming metal layers, and finally etching the metal layers.

As shown in FIG. 1, in current technology, after photolithography of an organic layer M1, an edge slope angle a of the organic layer is a right angle, or approximately a right angle. On this basis, various problems occur when depositing a metal layer M2: for example, as shown in FIG. 1 (1), a thickness of the metal layer M2 at an edge slope angle is much greater than that of other areas, giving rise to etching residues, etc. As another example, as shown in FIG. 1 (2), a thickness of the metal layer M2 at edge slope angle is much less than that of other areas, causing a resistance of the metal layer M2 to be significantly higher than that of a flat area.

Therefore, it is imperative to overcome a problem existing in conventional OLED display panels that edge slope angles of organic layers are approximately a right angle.

SUMMARY OF THE INVENTION

The present application provides an organic light-emitting diode (OLED) display panel and a mask to mitigate a technical problem existing in conventional OLED display panels that edge slope corners of organic layers are formed at approximately a right angle.

To overcome the above-mentioned problem, the present application provides a technical solution as follows:

An organic light-emitting diode (OLED) display panel of an embodiment of the present application, comprises: a substrate; a first film layer disposed on the substrate; and a second film layer disposed on the first film layer and made of an organic material; wherein the second film layer comprises an edge slope corner formed at an acute angle less than a predetermined value.

In the OLED display panel of the embodiment of the present application, in a cross-section perpendicular to the substrate and an edge of the second film layer, the edge slope corner of the second film layer has a slope being one of a straight line, a concave arc, a fold line, a convex arc, and any combinations thereof.

In the OLED display panel of the embodiment of the present application, the second film layer is one of a transparent organic filling layer, a planarization layer, a pixel definition layer, and a retaining wall layer.

The present application further provides a mask, comprising a transparent substrate and an opaque pattern disposed on the transparent substrate, wherein the mask is configured to fabricate the second film layer of the organic light-emitting diode (OLED) display panel of claim 1 and comprises: a full-shadow area, wherein an area on the transparent substrate corresponding to the full-shadow area is covered with an opaque film, and the opaque film has a light opacity for light of a predetermined color greater than or equal to a first predetermined threshold; a full-transparent area, wherein an area on the transparent substrate corresponding to the full-transparent area is not covered with the opaque pattern, and the transparent substrate has a light transmittance for the light of the predetermined color greater than a second predetermined threshold; and a half-shadow area disposed between the full-shadow area and the full-transparent area, wherein a plurality of non-transparent stripes are disposed on an area on the transparent substrate corresponding to the half-shadow area in a predetermined arrangement, and the non-transparent stripes have a light opacity for light of a predetermined color greater than or equal to the first predetermined threshold.

In the mask of the embodiment of the present application, a width of each of the non-transparent stripes gradually decreases in a direction from the full-shadow area to the full-transparent area.

In the mask of the embodiment of the present application, each of the non-transparent stripes has a width the same as each other.

In the mask of the embodiment of the present application, the non-transparent stripes are spaced apart from each other at gaps gradually decreasing in a direction from the full-shadow area to the full-transparent area.

In the mask of the embodiment of the present application, the non-transparent stripes are spaced apart from each other at gaps gradually increasing in a direction from the full-shadow area to the full-transparent area.

In the mask of the embodiment of the present application, the non-transparent stripes are spaced apart at gaps the same as each other.

In the mask of the embodiment of the present application, the non-transparent stripes are spaced apart at gaps the same as each other, and each of the non-transparent stripes has a width the same as each other.

In the mask of the embodiment of the present application, a width of each of the non-transparent stripes gradually decreases in a direction from the full-shadow area to the full-transparent area, and the non-transparent stripes are spaced apart from each other at gaps gradually decreasing in the direction from the full-shadow area to the full-transparent area.

In the mask of the embodiment of the present application, a width of each of the non-transparent stripes gradually decreases in a direction from the full-shadow area to the full-transparent area, and the non-transparent stripes are spaced apart from each other at gaps gradually increasing in the direction from the full-shadow area to the full-transparent area.

In the mask of the embodiment of the present application, a width of each of the non-transparent stripes gradually decreases in a direction from the full-shadow area to the full-transparent area, and the non-transparent stripes are spaced apart at gaps the same as each other.

In the mask of the embodiment of the present application, each of the non-transparent stripes has a width the same as each other, and the non-transparent stripes are spaced apart from each other at gaps gradually decreasing in the direction from the full-shadow area to the full-transparent area.

In the mask of the embodiment of the present application, each of the non-transparent stripes has a width the same as each other, and the non-transparent stripes are spaced apart from each other at gaps gradually increasing in the direction from the full-shadow area to the full-transparent area.

In the mask of the embodiment of the present application, the non-transparent stripes are metal stripes.

In the mask of the embodiment of the present application, the opaque film is made of a material the same as that of the non-transparent stripes.

In the mask of the embodiment of the present application, the opaque film and the non-transparent stripes are all made of chromium having a light opacity of 100%.

In the mask of the embodiment of the present application, the opaque film is made of at least one of silver and copper, and the non-transparent stripes are made of chromium having a light opacity of 100%.

In the mask of the embodiment of the present application, the non-transparent stripes are one of a straight line, a broken line, a curved line, and any combinations thereof.

The present application has advantageous effects as follows: the present application provides an OLED display panel and a mask, the OLED display panel includes a first film layer, a second film layer disposed on the first film layer and made of an organic material, wherein the second film layer includes an edge slope corner formed at an acute angle less than a predetermined value. In this application, since the edge slope corner of the second film layer is formed at the acute angle less than the predetermined value, after a metal layer is subsequently formed, a problem that a thickness of the metal layer at the edge slope corner is much greater than that of other areas, or a thickness of the metal layer on the edge slope corner is much less than that of other areas is not to occur, so that a technical problem existing in conventional OLED display panels that edge slope corners of organic layers are formed at approximately a right angle can be mitigated, thereby improving panel yield.

BRIEF DESCRIPTION OF THE SEVERAL VIEWS OF THE DRAWINGS

To better illustrate embodiments or technical solutions in the prior art, a brief description of the drawings used in the embodiments or the prior art description will be given below. Obviously, the accompanying drawings in the following description merely show some embodiments of the present invention, and a person skilled in the art may still derive other drawings from these accompanying drawings without creative efforts.

FIGS. 1(1) and 1(2) are schematic views showing a fabrication process of a conventional organic light-emitting diode (OLED) display panel.

DESCRIPTION OF SPECIFIC EMBODIMENTS OF THE INVENTION

Figure 2:
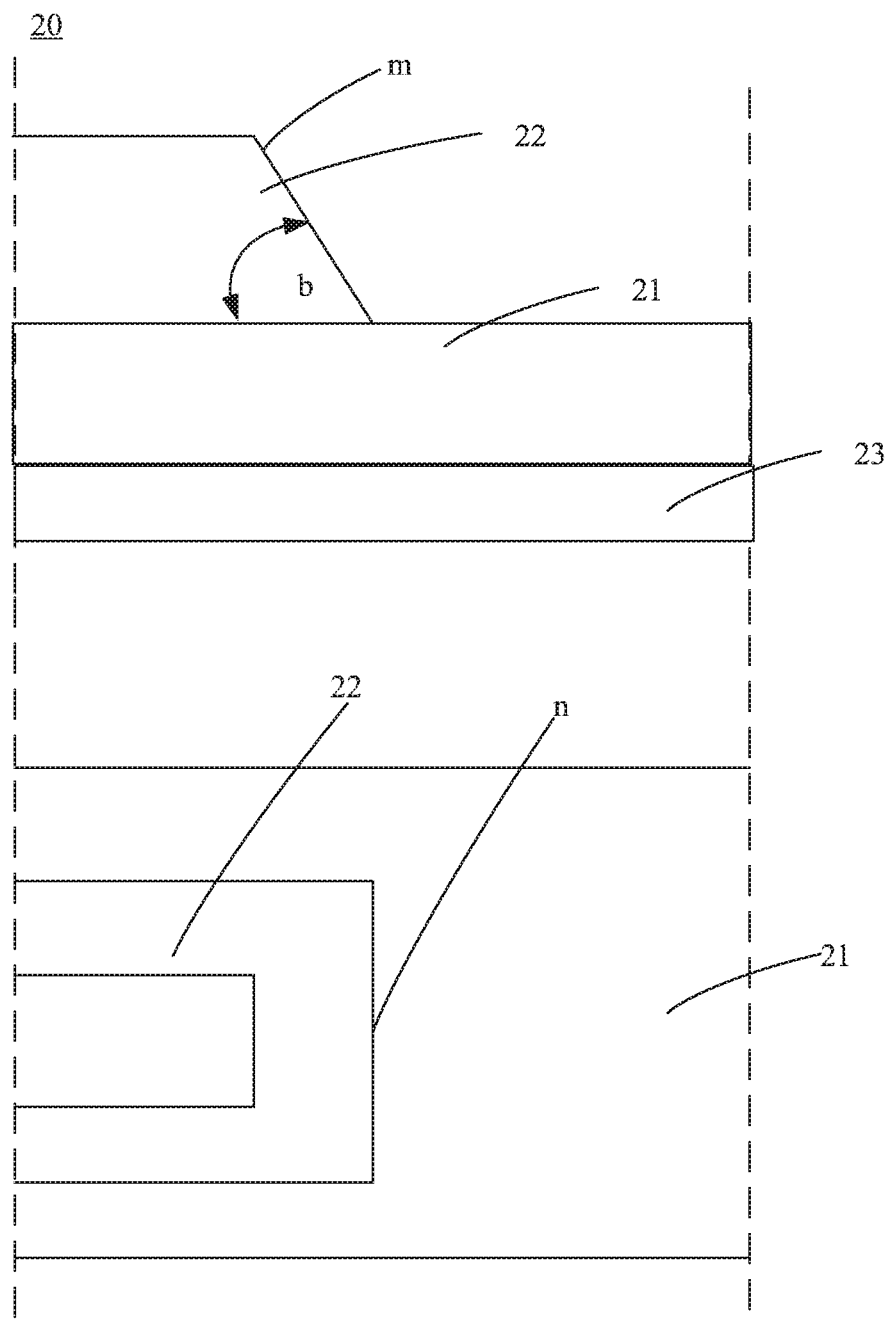
FIG. 2 is a schematic view of film layers of an OLED display panel of an embodiment of the present application.

The following embodiments are referring to the accompanying drawings for exemplifying specific implementable embodiments of the present invention. Directional terms described by the present invention, such as upper, lower, front, back, left, right, inner, outer, side and etc., are only directions by referring to the accompanying drawings, and thus the used directional terms are used to describe and understand the present invention, but the present invention is not limited thereto. The same reference numerals in the drawings denote the same elements.

In the embodiment of the present application, an edge slope corner refers to a corner having an angle formed by an edge slope of a certain film layer and a bottom of the film layer, as an angle a shown in FIG. 1 and an angle b shown in FIG. 2, etc.

The embodiment of the present application can mitigate a technical problem that an edge slope corner of organic layers of conventional organic light-emitting diode (OLED) display panels is formed at approximately a right angle.

In one embodiment, as shown in FIG. 2, the present application provides an OLED display panel 20 including: a substrate 23; a first film layer 21 disposed on the substrate 23; and a second film layer 22 disposed on the first film layer 21 and made of an organic material. The second film layer 22 includes an edge slope corner b formed at an acute angle less than a predetermined value.

The embodiment provides an OLED display panel. The OLED display panel includes a first film layer, and a second film layer disposed on the first film layer and made of an organic material. The second film layer includes an edge slope corner formed at an acute angle less than a predetermined value. In this application, since the edge slope corner of the second film layer is formed at the acute angle less than the predetermined value, after a metal layer is subsequently formed, a problem that a thickness of the metal layer at the edge slope corner is much greater than that of other areas, or a thickness of the metal layer on the edge slope corner is much less than that of other areas is not to occur, so that a technical problem existing in conventional OLED display panels that edge slope corners of organic layers are formed at approximately a right angle can be mitigated, thereby improving panel yield.

In one embodiment, as shown in FIG. 2, in a cross-section perpendicular to the substrate 23 and an edge n of the second film layer, the edge slope corner b of the second film layer 22 has a slope m being a straight line.

In one embodiment, in a cross-section perpendicular to the substrate 23 and an edge n of the second film layer, the edge slope corner b of the second film layer 22 has a slope m being one of a straight line, a concave arc, a fold line, a convex arc, and any combinations thereof.

In one embodiment, the second film layer is one of a transparent organic filling layer, a planarization layer, a pixel definition layer, and a retaining wall layer.

In one embodiment, the predetermined value is any one of 45 degrees to 75 degrees.

Figure 5:
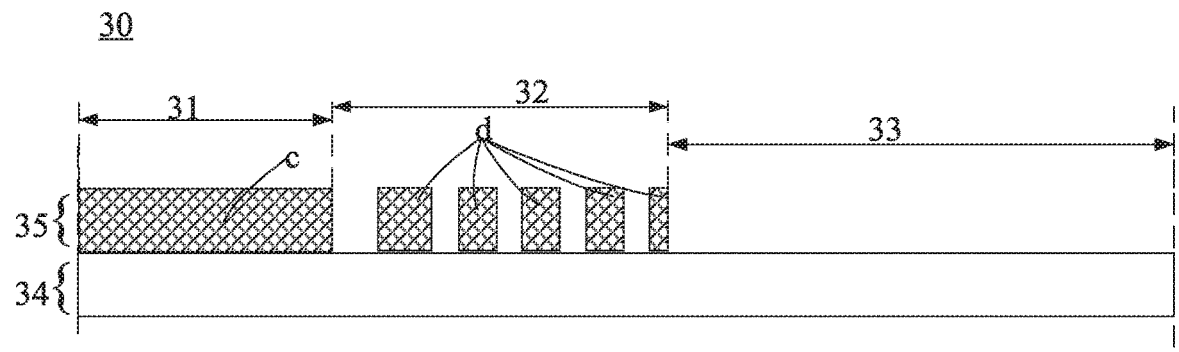
FIG. 5 is a schematic structural view of a mask of an embodiment of the present application.

In one embodiment, as shown in FIG. 5, the present application provides a mask 30 including a transparent substrate 34 and an opaque pattern 35 disposed on the transparent substrate 34 to form a second film layer of an OLED display panel of an embodiment of the present application.

The mask 30 includes a full-shadow area 31. An area on the transparent substrate 34 corresponding to the full-shadow area 31 is covered with an opaque film c. The opaque film c has a light opacity for light of a predetermined color greater than or equal to a first predetermined threshold A full-transparent area 33, wherein an area on the transparent substrate 34 corresponding to the full-transparent area is not covered with the opaque pattern 35, and the transparent substrate 34 has a light transmittance for the light of the predetermined color greater than a second predetermined threshold.

A half-shadow area 32 is disposed between the full-shadow area 31 and the full-transparent area 33. A plurality of non-transparent stripes d are disposed on an area on the transparent substrate 34 corresponding to the half-shadow area 32 in a predetermined arrangement, and the non-transparent stripes d have a light opacity for light of a predetermined color greater than or equal to the first predetermined threshold.

The embodiment provides the mask, based on disposing of the half-shadow area, when fabricating an organic film layer of the OLED display panel using the mask, an edge slope corner of the organic film layer is formed at an acute angle less than a predetermined value. In this application, since the edge slope corner of the second film layer is formed at the acute angle less than the predetermined value, after a metal layer is subsequently formed, a problem that a thickness of the metal layer at the edge slope corner is much greater than that of other areas, or a thickness of the metal layer on the edge slope corner is much less than that of other areas is not to occur, so that a technical problem existing in conventional OLED display panels that edge slope corners of organic layers reformed at approximately a right angle can be mitigated, thereby improving panel yield.

In one embodiment of the present application, the light of the predetermined color refers to light of a corresponding color required for a patterning process of the second film layer 22. A different material of the second film layer 22 is corresponding to different light of the predetermined color.

In one embodiment of the present application, the first predetermined threshold is any one of a value between 90% and 100%.

In one embodiment of the present application, the second predetermined threshold is any one of a value between 80% and 100%.

In one embodiment, a width of each of the non-transparent stripes d gradually decreases in a direction from the full-shadow area to the full-transparent area.

In one embodiment, each of the non-transparent stripes d has a width the same as each other.

In one embodiment, the non-transparent stripes d are spaced apart from each other at gaps gradually decreasing in a direction from the full-shadow area to the full-transparent area.

In one embodiment, the non-transparent stripes d are spaced apart from each other at gaps gradually increasing in a direction from the full-shadow area to the full-transparent area.

In one embodiment, the non-transparent stripes d are spaced apart at gaps the same as each other.

In one embodiment, the non-transparent stripes d are spaced apart at gaps the same as each other, and each of the non-transparent stripes has a width the same as each other.

In one embodiment, a width of each of the non-transparent stripes d gradually decreases in a direction from the full-shadow area to the full-transparent area, and the non-transparent stripes d are spaced apart from each other at gaps gradually decreasing in the direction from the full-shadow area to the full-transparent area.

In one embodiment, a width of each of the non-transparent stripes d gradually decreases in a direction from the full-shadow area to the full-transparent area, and the non-transparent stripes d are spaced apart from each other at gaps gradually increasing in the direction from the full-shadow area to the full-transparent area.

In one embodiment, a width of each of the non-transparent stripes d gradually decreases in a direction from the full-shadow area to the full-transparent area, and the non-transparent stripes d are spaced apart at gaps the same as each other.

In one embodiment, each of the non-transparent stripes d has a width the same as each other, and the non-transparent stripes d are spaced apart from each other at gaps gradually decreasing in the direction from the full-shadow area to the full-transparent area.

In one embodiment, each of the non-transparent stripes d has a width the same as each other, and the non-transparent stripes d are spaced apart from each other at gaps gradually increasing in the direction from the full-shadow area to the full-transparent area.

In one embodiment, each of the non-transparent stripes d is at least one of a straight line, a fold line, and a curve line.

In one embodiment, the non-transparent stripes d are metal stripes.

In one embodiment, the opaque film c in the full-shadow area 31 is an opaque metal film.

In one embodiment, the opaque film c in the full-shadow area 31 is made of a material different from that of the non-transparent stripes d in the half-shadow area 32.

In one embodiment, the opaque film c in the full-shadow area 31 is made of at least one of silver, copper, and the like, and the non-transparent stripes d in the half-shadow area 32 are made of chromium having a light opacity of 100%.

In one embodiment, the opaque film c in the full-shadow 31 and the non-transparent stripes d in the half-shadow area 32 are all made of a same material.

In one embodiment, the opaque film c in the full-shadow 31 and the non-transparent stripes d in the half-shadow area 32 are all made of chromium having a light opacity of 100%.

In one embodiment, the transparent substrate 34 is made of glass or the like.

The present application is further described by taking the second film layer as a transparent filling layer as an example.

As shown in FIG. 1(1), it is a schematic view showing that metal residues appear at an edge of a transparent organic filling layer M1 at a lower frame.

In FIG. 1 (1), an edge slope corner a of the transparent organic filling layer M1 is formed at a right angle. Since the metal layer M2 is not completely anisotropic when deposited, a thick metal layer M2 is inevitably formed at the edge slope corner a. When being etched by a normal dose the same as that of a display area, the metal layer M2 may be incompletely etched at a corner position, and residual metal may cause short-circuits of adjacent electrodes or become a channel for electrostatic discharge, which will ultimately reduce the yield of OLED display panels.

In FIG. 1 (1), from bottom to top, it is shown as a substrate M3, the transparent organic filling layer M1, and the metal layer M2. In an N step, the organic filling layer M1 on the substrate M3 forms a right-angled edge slope corner a after photolithography. After the deposition of the metal layer M2 in a step N+1, a thick metal layer M2 is formed near the edge slope corner a. After a metal layer etching process in a subsequent N+2 step, a residual metal layer M2 appears at the edge slope corner a. As a result, the residual metal layer M2 may bring a risk of short circuits near a metal electrode, rendering panel circuits ineffective.

Figure 3:
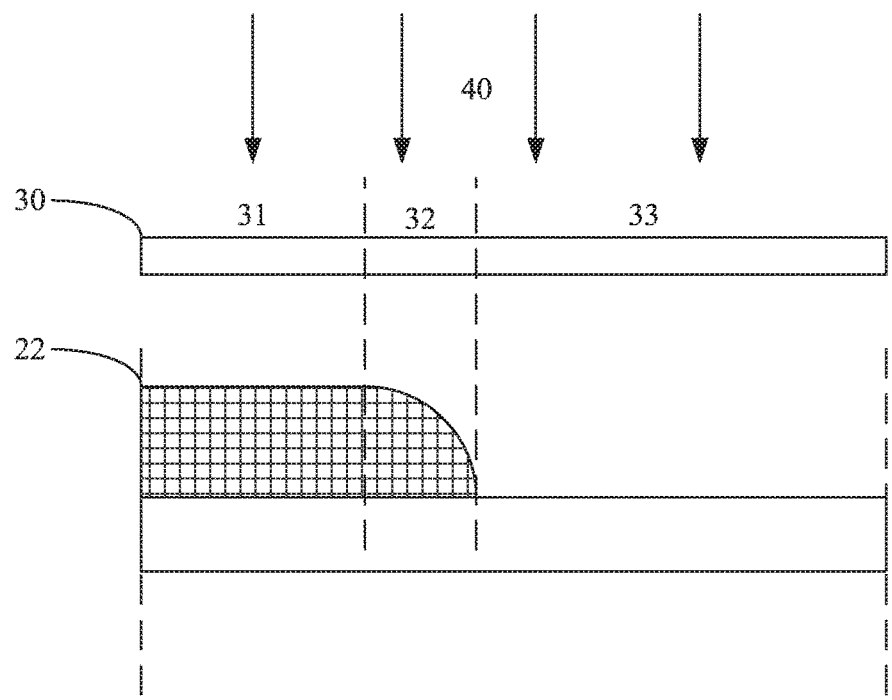
FIG. 3 is a first schematic view showing a fabrication of an OLED display panel of an embodiment of the present application.
Figure 4:
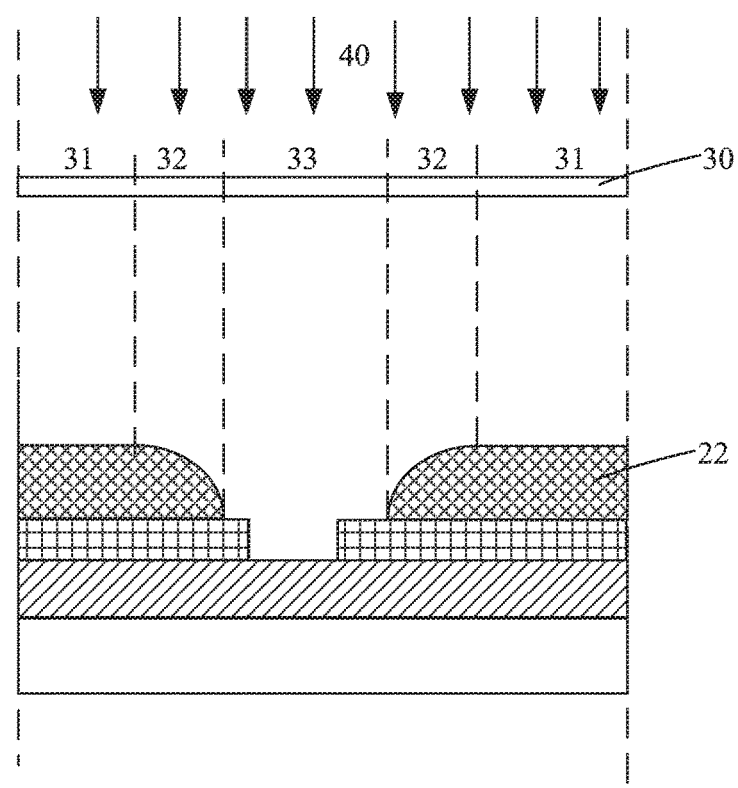
FIG. 4 is a second schematic view showing a fabrication of an OLED display panel of an embodiment of the present application.

As shown in FIG. 3, an ultraviolet light 40 is perpendicularly incident on the mask 30, and the ultraviolet light passing through the full-shadow area 31 is almost completely blocked, so that the transparent organic filling layer 22 corresponding to the full-shadow area 31 can be completely retained. The ultraviolet light passing through the full-transparent area 33 is almost completely transmitted, so that the transparent organic filling layer 22 corresponding to the full-transparent area 33 can be completely removed. An intensity of the ultraviolet light passing through the half-shadow area 32 gradually changes from zero to 100% from left to right, so that a thickness of the transparent organic filling layer 22 corresponding to the half-shadow area 32 gradually decreases from left to right to zero, and the transparent organic filling layer 22 having a graded edge slope corner is finally formed on the substrate M3.

Figure 6:
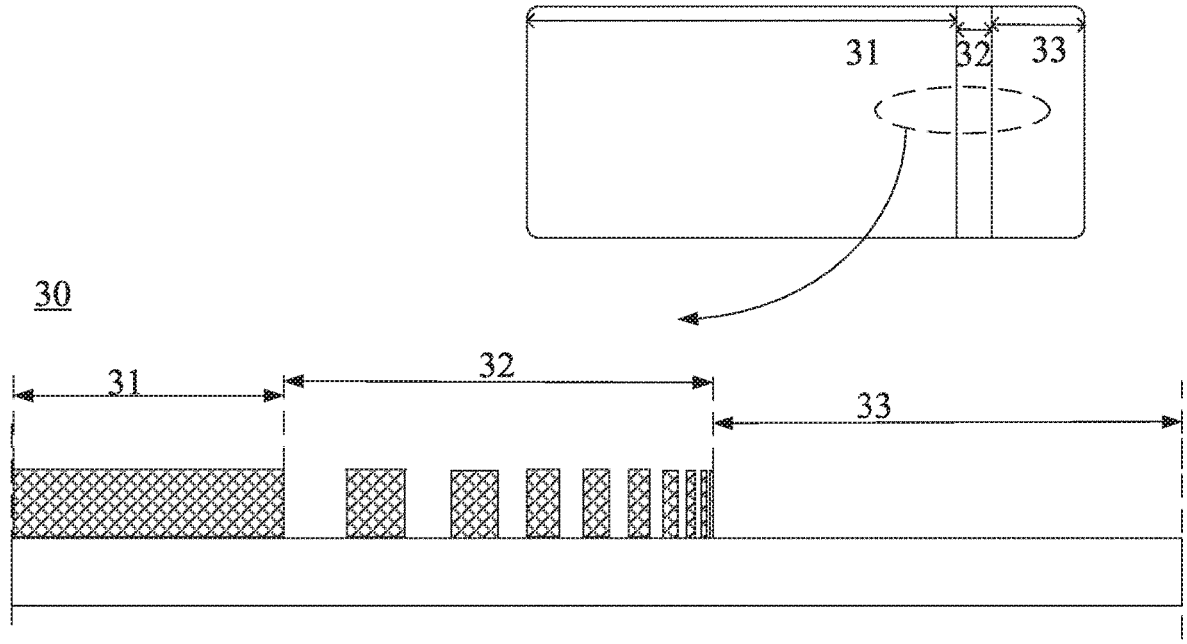
FIG. 6 is a schematic view showing a first configuration of a mask of an embodiment of the present application.

In this embodiment, the mask 30 is shown in FIG. 6, and the non-transparent stripes d are straight lines.

In one embodiment, in a direction from the full-shadow area to the full-transparent area, a width of each of the non-transparent stripes d is 5 microns (μm), 4 μm, 3 μm, 2 μm, 1 μm, 0.5 μm, and 0.1 μm in sequence, and gaps among the non-transparent stripes are each 5 μm, 4 μm, 3 μm, 2 μm, 1 μm, 0.5 μm, and 0.1 μm in sequence.

The present application is further described by taking the second film layer as a planarization layer (or a pixel definition layer) as an example.

As shown in FIG. 1 (2), at a position of a via hole on a planarization layer (or a pixel definition layer) M1, a first metal layer M2 is deposited on an insulating layer M3, and a via hole of a passivation layer M5 and a via hole of a planarization layer (or a pixel definition layer) M1 are sequentially disposed on the first metal layer M2. Since a second metal layer M4 is not completely anisotropic when deposited, the second metal layer M4 is inevitably formed with a thinner thickness on a side of the via hole of the planarization layer (or the pixel definition layer) M1, causing a resistance of the second metal layer M4 on a side of the via hole of the planarization layer (or the pixel definition layer) M1 to be significantly higher than that of the second metal layer M4 in a flat area of the planarization layer (or the pixel definition layer) M1, and thus a noticeable pressure drop will be produced throughout a display area.

As shown in FIG. 5, an ultraviolet light 40 is perpendicularly incident on the mask 30, and the ultraviolet light passing through the full-shadow area 31 is almost completely blocked, so that the planarization layer 22 corresponding to the full-shadow area 31 can be completely retained. The ultraviolet light passing through the full-transparent area 33 is almost completely transmitted, so that the planarization layer 22 corresponding to the full-transparent area 33 can be completely removed. An intensity of the ultraviolet light passing through the half-shadow area 32 gradually changes from zero to 100% from the full-shadow area 31 to the full-transparent area 33, so that a thickness of the planarization layer 22 corresponding to the half-shadow area 32 gradually decreases from the full-shadow area 31 to the full-transparent area 33 to zero, and the planarization layer 22 having a graded edge slope corner is finally formed.

Figure 7:
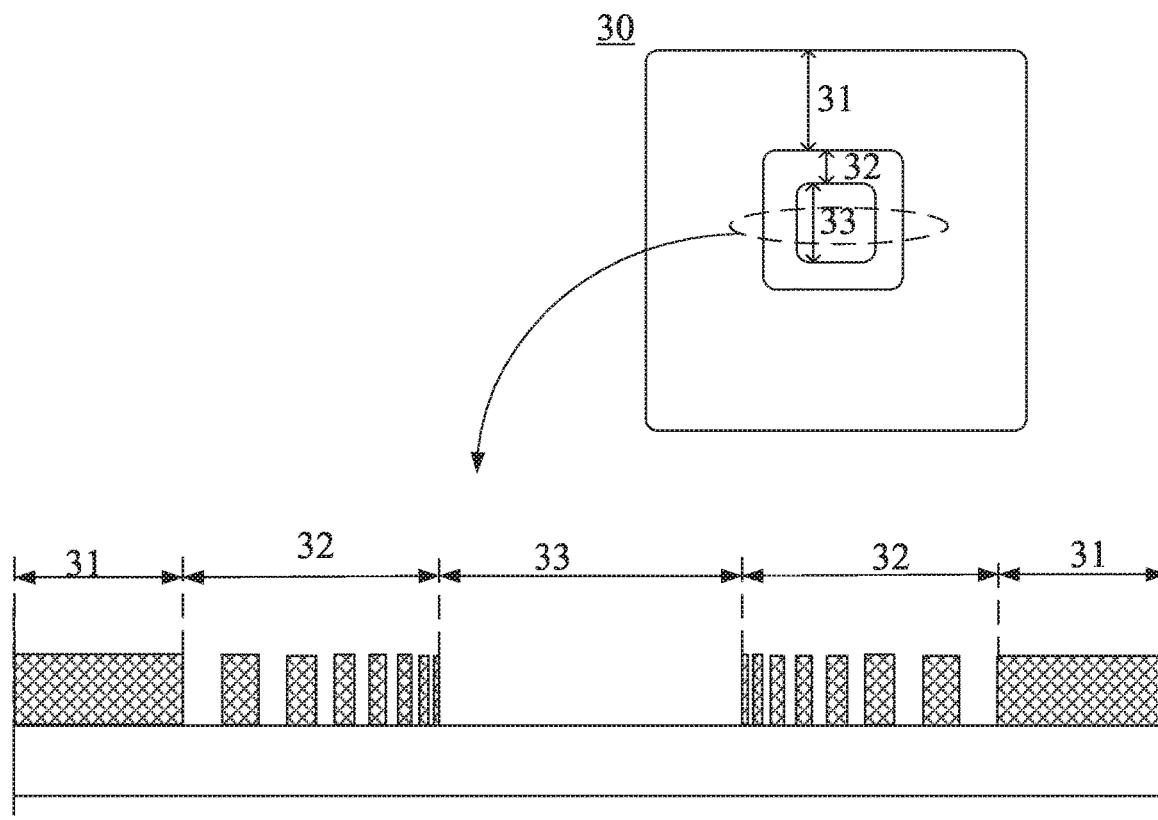
FIG. 7 is a schematic view showing a second configuration of a mask of an embodiment of the present application.

In this embodiment, the mask 30 is shown in FIG. 7, and the non-transparent stripes d are straight lines.

In one embodiment, as shown in FIG. 7, in a direction from the full-shadow area to the full-transparent area, a width of each of the non-transparent stripes d is 0.5 μm, 0.4 μm, 0.3 μm, 0.2 μm, and 0.1 μm in sequence, and gaps among the non-transparent stripes are each 0.5 μm, 0.4 μm, 0.3 μm, 0.2 μm, and 0.1 μm in sequence.

The present application is further described by taking the second film layer 22 as a retaining wall layer as an example.

Figure 8:
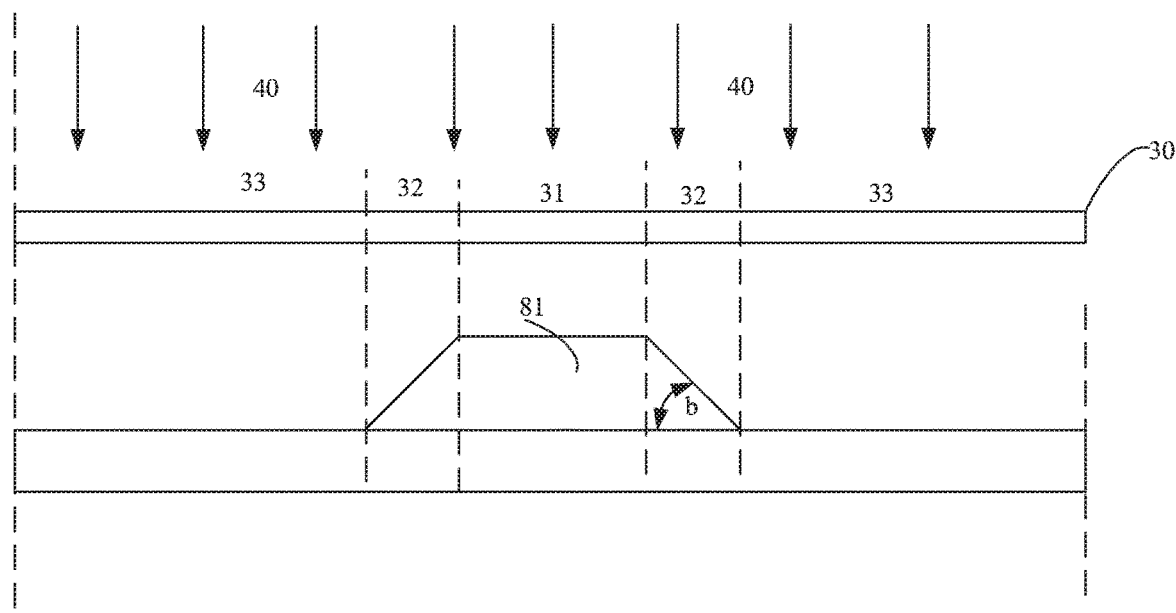
FIG. 8 is a third schematic view showing a fabrication of an OLED display panel of an embodiment of the present application.

As shown in FIG. 8, a retaining wall layer in a display area needs to be patterned to form a protruding retaining wall 81. If an edge slope corner b of the retaining wall 81 is formed at a right angle or a substantially right angle, the retaining wall 81 is prone to collapsed, and therefore it is necessary to control the edge slope corner b of the retaining wall 81 to a predetermined value.

As shown in FIG. 8, an ultraviolet light 40 is perpendicularly incident on the mask 30, and the ultraviolet light passing through the full-shadow area 31 is almost completely blocked, so that the retaining wall layer 22 corresponding to the full-shadow area 31 can be completely retained. The ultraviolet light passing through the full-transparent area 33 is almost completely transmitted, so that the retaining wall layer 22 corresponding to the full-transparent area 33 can be completely removed. An intensity of the ultraviolet light passing through the half-shadow area 32 gradually changes from zero to 100% from the full-shadow area 31 to the full-transparent area 33, so that a thickness of the retaining wall layer 22 corresponding to the half-shadow area 32 gradually decreases from the full-shadow area 31 to the full-transparent area 33 to zero, and the retaining wall layer 22 having a graded edge slope corner is finally formed.

Figure 9:
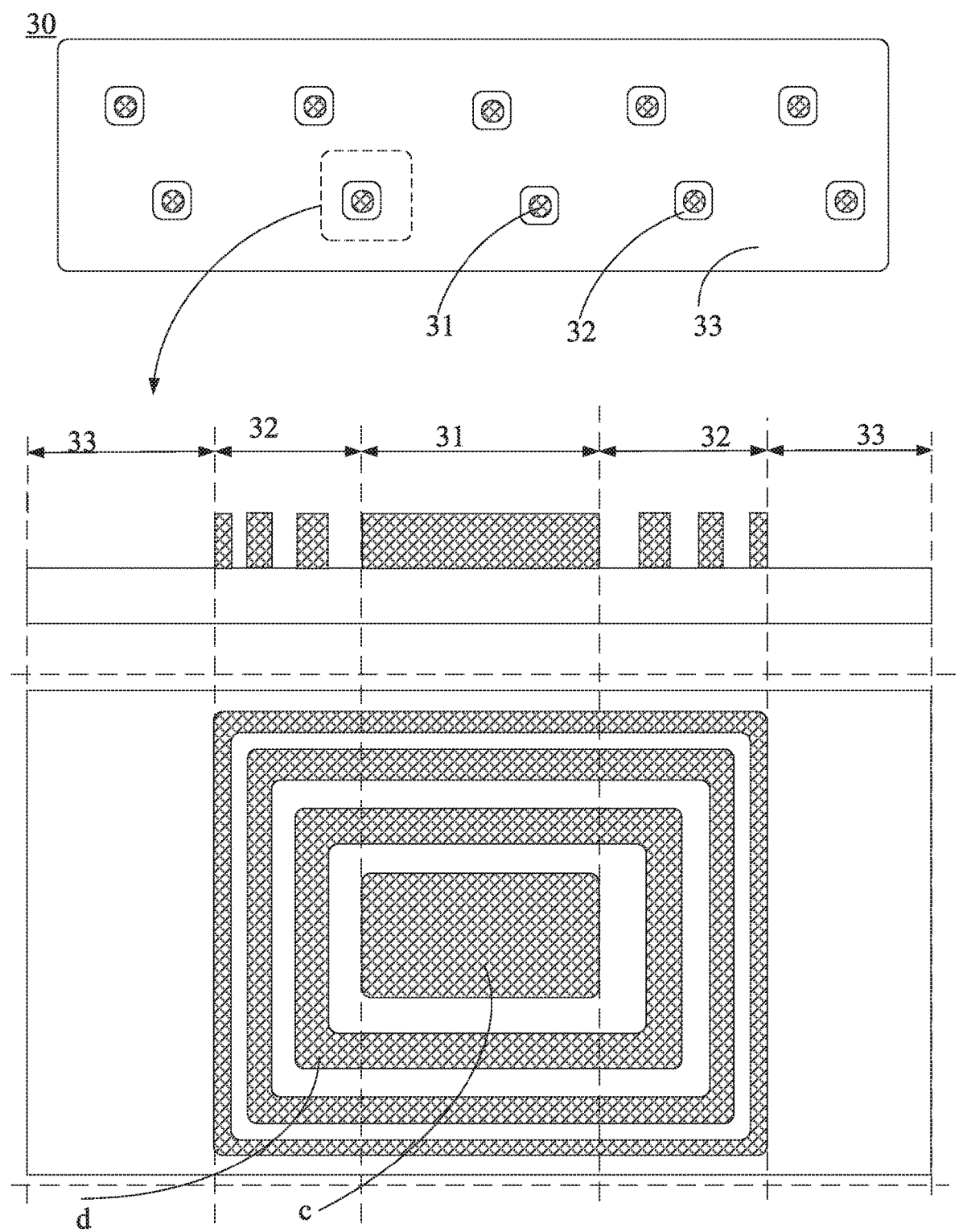
FIG. 9 is a schematic view showing a third configuration of a mask of an embodiment of the present application.

In this embodiment, the mask 30 is shown in FIG. 9, and the non-transparent stripes d are each a closed rectangle composed of straight lines, etc.

In one embodiment, as shown in FIG. 9, in a direction from the full-shadow area to the full-transparent area, a width of each of the non-transparent stripes d is 10 μm, 8 μm, and 6 μm in sequence, and gaps among the non-transparent stripes are each 10 μm, 8 μm, and 6 μm in sequence.

In accordance with the above-mentioned embodiments, the present application provides an OLED display panel and a mask, the OLED display panel includes a first film layer, a second film layer disposed on the first film layer and made of an organic material, wherein the second film layer includes an edge slope corner formed at an acute angle less than a predetermined value. In this application, since the edge slope corner of the second film layer is formed at the acute angle less than the predetermined value, after a metal layer is subsequently formed, a problem that a thickness of the metal layer at the edge slope corner is much greater than that of other areas, or a thickness of the metal layer on the edge slope corner is much less than that of other areas is not to occur, so that a technical problem existing in conventional OLED display panels that edge slope corners of organic layers are formed at approximately a right angle can be mitigated, thereby improving panel yield.

Accordingly, although the present invention has been disclosed as a preferred embodiment, it is not intended to limit the present invention. Those skilled in the art without departing from the spirit and scope of the present invention may make various changes or modifications, and thus the scope of the present invention should be after the appended claims and their equivalents.

What is claimed is:

1. A mask, adapted for an organic light-emitting diode (OLED) display panel comprising a substrate, a first film layer disposed on the substrate, and a second film layer disposed on the first film layer and made of an organic material, wherein the second film layer comprises an edge slope corner formed at an acute angle less than a predetermined value, configured to fabricate the second film layer, and comprising:
   a transparent substrate and an opaque pattern disposed on the transparent substrate;
   a full-shadow area, wherein an area on the transparent substrate corresponding to the full-shadow area is covered with an opaque film, and the opaque film has a light opacity for light of a predetermined color greater than or equal to a first predetermined threshold;
   a full-transparent area, wherein an area on the transparent substrate corresponding to the full-transparent area is not covered with the opaque pattern, and the transparent substrate has a light transmittance for the light of the predetermined color greater than a second predetermined threshold; and
   a half-shadow area disposed between the full-shadow area and the full-transparent area, wherein a plurality of non-transparent stripes are disposed on an area on the transparent substrate corresponding to the half-shadow area in a predetermined arrangement, a width of each of the non-transparent stripes gradually decreases in a direction from the full-shadow area to the full-transparent area, and the non-transparent stripes have a light opacity for light of a predetermined color greater than or equal to the first predetermined threshold.

2. The mask of claim 1, wherein the non-transparent stripes are spaced apart from each other at gaps gradually increasing in a direction from the full-shadow area to the full-transparent area.

3. The mask of claim 1, wherein the non-transparent stripes are spaced apart at gaps the same as each other.

4. The mask of claim 1, wherein the non-transparent stripes are metal stripes.

5. The mask of claim 1, wherein the opaque film is made of a material the same as that of the non-transparent stripes.

6. The mask of claim 1, wherein the opaque film and the non-transparent stripes are all made of chromium having a light opacity of 100%.

7. The mask of claim 1, wherein the non-transparent stripes are one of a straight line, a broken line, a curved line, and any combinations thereof.

8. A mask, adapted for an organic light-emitting diode (OLED) display panel comprising a substrate, a first film layer disposed on the substrate, and a second film layer disposed on the first film layer and made of an organic material, wherein the second film layer comprises an edge slope corner formed at an acute angle less than a predetermined value, and configured to fabricate the second film layer and comprising:
   a transparent substrate and an opaque pattern disposed on the transparent substrate;
   a full-shadow area, wherein an area on the transparent substrate corresponding to the full-shadow area is covered with an opaque film, and the opaque film has a light opacity for light of a predetermined color greater than or equal to a first predetermined threshold;
   a full-transparent area, wherein an area on the transparent substrate corresponding to the full-transparent area is not covered with the opaque pattern, and the transparent substrate has a light transmittance for the light of the predetermined color greater than a second predetermined threshold; and
   a half-shadow area disposed between the full-shadow area and the full-transparent area, wherein a plurality of non-transparent stripes are disposed on an area on the transparent substrate corresponding to the half-shadow area in a predetermined arrangement and are spaced apart from each other at gaps gradually decreasing in a direction from the full-shadow area to the full-transparent area, and the non-transparent stripes have a light opacity for light of a predetermined color greater than or equal to the first predetermined threshold.

9. The mask of claim 8, wherein each of the non-transparent stripes has a width the same as each other.

10. The mask of claim 8, wherein the opaque film is made of a material the same as that of the non-transparent stripes.

11. A mask, adapted for an organic light-emitting diode (OLED) display panel comprising a substrate, a first film layer disposed on the substrate, and a second film layer disposed on the first film layer and made of an organic material, wherein the second film layer comprises an edge slope corner formed at an acute angle less than a predetermined value, and configured to fabricate the second film layer and comprising:
   a transparent substrate and an opaque pattern disposed on the transparent substrate;
   a full-shadow area, wherein an area on the transparent substrate corresponding to the full-shadow area is covered with an opaque film made of at least one of silver and copper, and the opaque film has a light opacity for light of a predetermined color greater than or equal to a first predetermined threshold;
   a full-transparent area, wherein an area on the transparent substrate corresponding to the full-transparent area is not covered with the opaque pattern, and the transparent substrate has a light transmittance for the light of the predetermined color greater than a second predetermined threshold; and
   a half-shadow area disposed between the full-shadow area and the full-transparent area, wherein a plurality of non-transparent stripes made of chromium having a light opacity of 100% are disposed on an area on the transparent substrate corresponding to the half-shadow area in a predetermined arrangement, and the non-transparent stripes have a light opacity for light of a predetermined color greater than or equal to the first predetermined threshold.

12. The mask of claim 11, wherein each of the non-transparent stripes has a width the same as each other.

13. The mask of claim 11, wherein the opaque film is made of a material the same as that of the non-transparent stripes.

* * * * *